(12) United States Patent　　　(10) Patent No.: US 12,581,998 B2

Ikeda et al.　　　　　　　　　　(45) Date of Patent: Mar. 17, 2026

(54) DISPLAY DEVICE

(71) Applicant: Magnolia White Corporation, Tokyo (JP)

(72) Inventors: Masanobu Ikeda, Minato-ku (JP); Yoshinori Tanaka, Minato-ku (JP); Jin Hirosawa, Minato-ku (JP)

(73) Assignee: Magnolia White Corporation, Tokyo (JP)

( * ) Notice: Subject to any disclaimer, the term of this patent is extended or adjusted under 35 U.S.C. 154(b) by 978 days.

(21) Appl. No.: 17/695,126

(22) Filed: Mar. 15, 2022

(65) Prior Publication Data

US 2022/0302096 A1　　Sep. 22, 2022

(30) Foreign Application Priority Data

Mar. 22, 2021　(JP) ................................. 2021-047647

(51) Int. Cl.
H10D 86/60　　　(2025.01)
H01L 23/00　　　(2006.01)
(Continued)

(52) U.S. Cl.
CPC ............ H01L 25/167 (2013.01); H01L 24/02 (2013.01); H01L 24/05 (2013.01); H10D 86/441 (2025.01); H10D 86/451 (2025.01); H10D 86/60 (2025.01); H10H 20/856 (2025.01); H01L 24/32 (2013.01); H01L 2224/02331 (2013.01); H01L 2224/0235 (2013.01); H01L 2224/02375 (2013.01); H01L 2224/02381 (2013.01); H01L 2224/0239 (2013.01); H01L 2224/05548 (2013.01);
(Continued)

(58) Field of Classification Search
None
See application file for complete search history.

(56) References Cited

U.S. PATENT DOCUMENTS 9,876,000 B2　1/2018　Bibl et al.
2013/0037812 A1 *　2/2013　Park ................... H10K 59/1213
438/34

(Continued)

FOREIGN PATENT DOCUMENTS

JP　　　2020-080361 A　　5/2020

OTHER PUBLICATIONS

Zhang et al. Reflective metal/semiconductor tunnel junctions for hole injection in AlGaN UV LEDs. Appl. Phys. Lett. Jul. 31, 2017; 111 (5): 051104 (Year: 2017).*

(Continued)

*Primary Examiner* — Yara B Green
*Assistant Examiner* — Seth D Lawson
(74) *Attorney, Agent, or Firm* — Maier & Maier, PLLC

(57) ABSTRACT

A display device includes a substrate, a plurality of light-emitting elements and a plurality of transistors provided to the substrate, a first organic insulating film that is provided covering the transistors and is in direct contact with at least one of a source electrode and a drain electrode of the transistors, an anode electrode provided on the first organic insulating film and electrically coupled to each of the light-emitting elements, a cavity formed in the first organic insulating film and recessed toward the substrate, and a reflective layer provided covering a side and a bottom of the cavity formed in the first organic insulating film.

7 Claims, 4 Drawing Sheets

(51) Int. Cl.
    H01L 25/16       (2023.01)
    H10D 86/40      (2025.01)
    H10H 20/856    (2025.01)

(52) U.S. Cl.
    CPC ............... *H01L 2224/05569* (2013.01); *H01L 2224/05624* (2013.01); *H01L 2224/05639* (2013.01); *H01L 2224/32145* (2013.01); *H01L 2924/12041* (2013.01); *H10D 86/481* (2025.01)

(56) References Cited

U.S. PATENT DOCUMENTS

| | | | |
|---|---|---|---|
| 2018/0097049 A1* | 4/2018 | Choi | H10K 71/00 |
| 2018/0247988 A1* | 8/2018 | Lee | H10K 59/124 |
| 2020/0411614 A1* | 12/2020 | Kim | H10K 59/122 |
| 2021/0265540 A1 | 8/2021 | Itou et al. | |

OTHER PUBLICATIONS

Tamaki et al., "A 3.9-inch LTPS TFT Full Color MicroLED Display with Novel Driving and Reflector Cavity Process", SID 2020 Digest, 2020, 4 pages.

* cited by examiner

FIG.5

DISPLAY DEVICE

CROSS-REFERENCE TO RELATED APPLICATION

This application claims the benefit of priority from Japanese Patent Application No. 2021-047647 filed on Mar. 22, 2021, the entire contents of which are incorporated herein by reference.

BACKGROUND

1. Technical Field

The present invention relates to a display device.

2. Description of the Related Art

Display devices provided with micro-sized light-emitting diodes (micro LEDs) as display elements have been attracting attention. To improve the light extraction efficiency, display devices provided with light-emitting diodes include a reflective structure that reflects light output from the side surfaces of the light-emitting diode toward the display surface (refer to U.S. Pat. No. 9,876,000, Japanese Patent Application Laid-open Publication No. 2020-080361, and Masaya Tamaki, et al., "A 3.9-inch LTPS TFT Full Color MicroLED Display with Novel Driving and Reflector Cavity Process", SID 2020 Digest, 2020; pp. 112-114, for example).

In such display devices, it is necessary to form a thick insulating film around the light-emitting diode to provide the reflective structure facing the side surfaces of the light-emitting diode. If the reflective structure fails to be formed to be high due to the restriction of thickness of a display device 1, it may possibly be difficult to improve the light extraction efficiency.

SUMMARY

A display device according to an embodiment of the present disclosure includes a substrate, a plurality of light-emitting elements and a plurality of transistors provided to the substrate, a first organic insulating film that is provided covering the transistors and is in direct contact with at least one of a source electrode and a drain electrode of the transistors, an anode electrode provided on the first organic insulating film and electrically coupled to each of the light-emitting elements, a cavity formed in the first organic insulating film and recessed toward the substrate, and a reflective layer provided covering a side and a bottom of the cavity formed in the first organic insulating film. The light-emitting element is disposed in the cavity and is electrically coupled to the reflective layer at the bottom of the cavity, and a side reflective layer of the reflective layer that covers the side of the cavity faces a side surface of the light-emitting element.

BRIEF DESCRIPTION OF THE DRAWINGS

FIG. 5 is a sectional view along line V-V' of FIG. 4.

DETAILED DESCRIPTION

Figure 1:
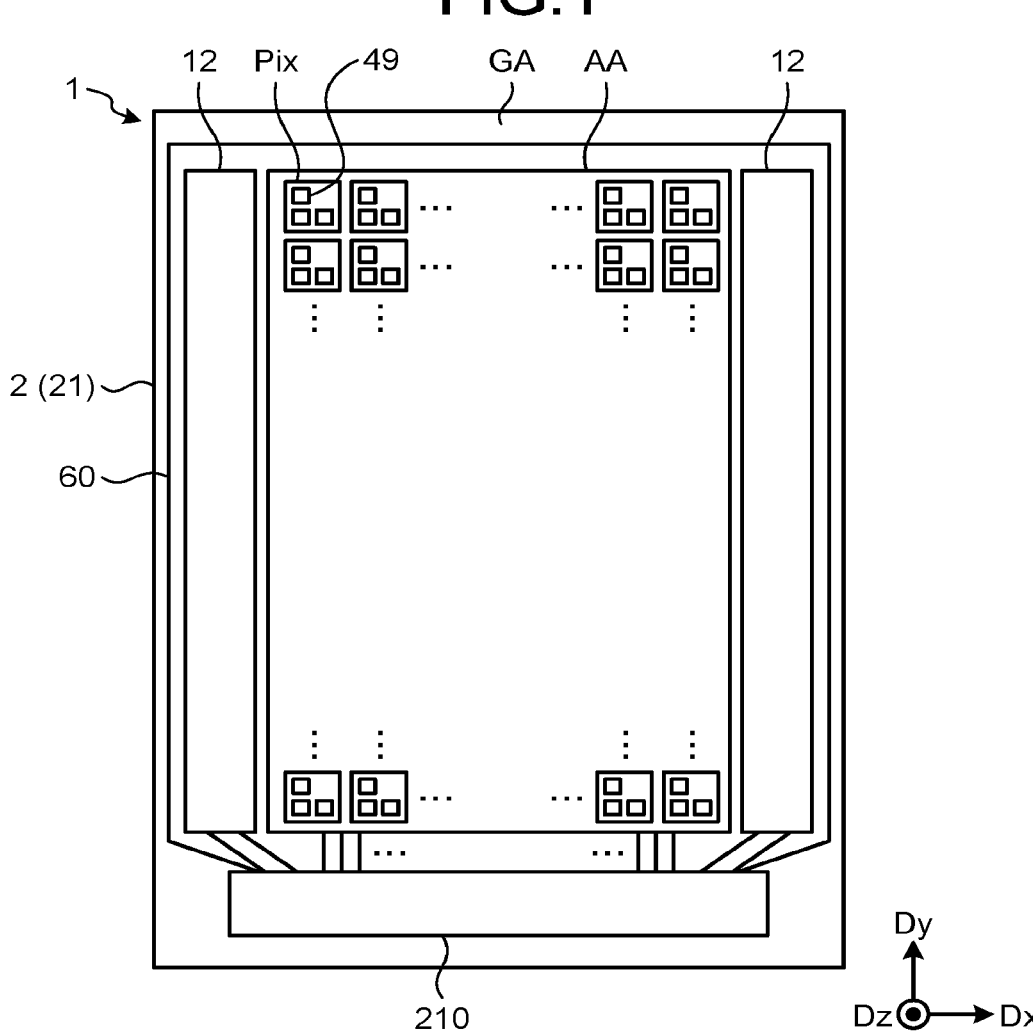
FIG. 1 is a plan view schematically illustrating a display device according to an embodiment.

Exemplary aspects (embodiments) to embody the present invention are described below in greater detail with reference to the accompanying drawings. The contents described in the embodiments below are not intended to limit the present invention. Components described below include components easily conceivable by those skilled in the art and components substantially identical therewith. Furthermore, the components described below may be appropriately combined. What is disclosed herein is given by way of example only, and appropriate modifications made without departing from the spirit of the present invention and easily conceivable by those skilled in the art naturally fall within the scope of the present invention. To simplify the explanation, the drawings may possibly illustrate the width, the thickness, the shape, and other elements of each unit more schematically than the actual aspect. These elements, however, are given by way of example only and are not intended to limit interpretation of the present invention. In the present specification and the drawings, components similar to those previously described with reference to previous drawings are denoted by like reference numerals, and detailed explanation thereof may be appropriately omitted.

To describe an aspect where a first structure is disposed on a second structure in the present specification and the claims, the term "on" includes both of the following cases unless otherwise noted: a case where the first structure is disposed directly on the second structure in contact with the second structure, and a case where the first structure is disposed on the second structure with another structure interposed therebetween.

First Embodiment

FIG. 1 is a plan view schematically illustrating a display device according to a first embodiment. As illustrated in FIG. 1, a display device 1 includes an array substrate 2, pixels Pix, drive circuits 12, a drive integrated circuit (IC) 210, and cathode wiring 60. The array substrate 2 is a drive circuit substrate that drives pixels Pix and is also called a backplane or an active matrix substrate. The array substrate 2 includes a substrate 21, a plurality of transistors, a plurality of capacitances, various kinds of wiring, and other components.

As illustrated in FIG. 1, the display device 1 has a display region AA and a peripheral region GA. The display region AA is disposed overlapping the pixels Pix and displays an image. The peripheral region GA does not overlap the pixels Pix and is positioned outside the display region AA.

The pixels Pix are arrayed in a first direction Dx and a second direction Dy in the display region AA of the substrate 21. The first direction Dx and the second direction Dy are parallel to the surface of the substrate 21. The first direction Dx is orthogonal to the second direction Dy. The first direction Dx may intersect the second direction Dy without being orthogonal thereto. A third direction Dz is orthogonal to the first direction Dx and the second direction Dy. The third direction Dz corresponds to the normal direction of the substrate 21, for example. In the following description, planar view indicates the positional relation viewed from the third direction Dz.

The drive circuits 12 drive a plurality of gate lines (e.g., a reset control signal line L5, an output control signal line L6, a pixel control signal line L7, and an initialization control signal line L8 (refer to FIG. 3)) based on various control signals supplied via wiring extending from the drive IC 210. The drive circuits 12 sequentially or simultaneously select a plurality of gate lines and supply gate drive signals to the selected gate lines. As a result, the drive circuits 12 select a plurality of pixels Pix coupled to the gate lines.

The drive IC 210 is a circuit that controls display on the display device 1. A plurality of wires extend from the drive IC 210 toward the pixels Pix (e.g., a video signal line L2, a reset power supply line L3, and an initialization power supply line L4 (refer to FIG. 3)). The drive IC 210 is mounted on the peripheral region GA of the substrate 21 as chip on glass (COG). The mounting form of the drive IC 210 is not limited thereto, and the drive IC 210 may be mounted on a flexible printed circuit board or a rigid circuit board coupled to the peripheral region GA of the substrate 21 as chip on film (COF).

The cathode wiring 60 is provided in the peripheral region GA of the substrate 21. The cathode wiring 60 is provided surrounding the pixels Pix in the display region AA and the drive circuits 12 in the peripheral region GA. Cathodes of a plurality of light-emitting elements 3 are coupled to the common cathode wiring 60 and are supplied with a fixed potential (e.g., a ground potential). More specifically, a cathode terminal 32 (refer to FIG. 5) of the light-emitting element 3 is coupled to the cathode wiring 60 through a cathode electrode 34.

Figure 2:
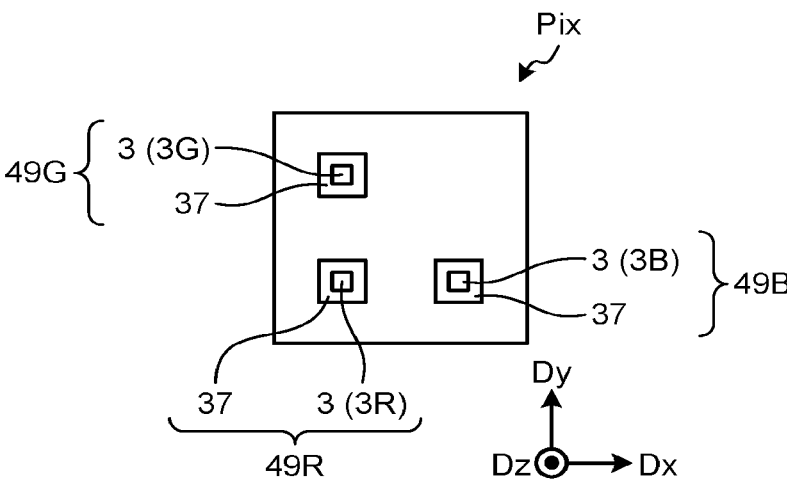
FIG. 2 is a plan view of a plurality of pixels.

FIG. 2 is a plan view of a plurality of pixels. As illustrated in FIG. 2, one pixel Pix includes a plurality of pixels 49. Examples of the pixel Pix include, but are not limited to, a pixel 49R, a pixel 49G, a pixel 49B, etc. The pixel 49R displays a primary color of red as the first color. The pixel 49G displays a primary color of green as the second color. The pixel 49B displays a primary color of blue as the third color. As illustrated in FIG. 2, the pixel 49R and the pixel 49B in one pixel Pix are arranged adjacent to each other in the first direction Dx. The pixel 49R and the pixel 49G are arranged adjacent to each other in the second direction Dy. The first color, the second color, and the third color are not limited to red, green, and blue, respectively, and may be any desired colors, such as complementary colors. In the following description, the pixel 49R, the pixel 49G, and the pixel 49B are simply referred to as the pixels 49 when they need not be distinguished from one another.

Each pixel 49 includes the light-emitting element 3 and a reflective layer 37. The display device 1 displays an image by outputting different light from each of the light-emitting elements 3R, 3G, and 3B in the pixels 49R, 49G, and 49B. The light-emitting element 3 is an inorganic light-emitting diode (LED) chip having a size of approximately 3 μm to 300 μm in planar view and is called a micro LED. The display device 1 including micro LEDs in respective pixels is also called a micro LED display device. The term "micro" of the micro LED is not intended to limit the size of the light-emitting element 3.

The light-emitting elements 3 may output different light in four or more colors. The positions of the pixels 49 are not limited to the configuration illustrated in FIG. 2. For example, the pixel 49R and the pixel 49B may be adjacent to each other in the second direction Dy. The pixels 49R, 49G, and 49B may be repeatedly arrayed in this order in the first direction Dx.

Figure 3:
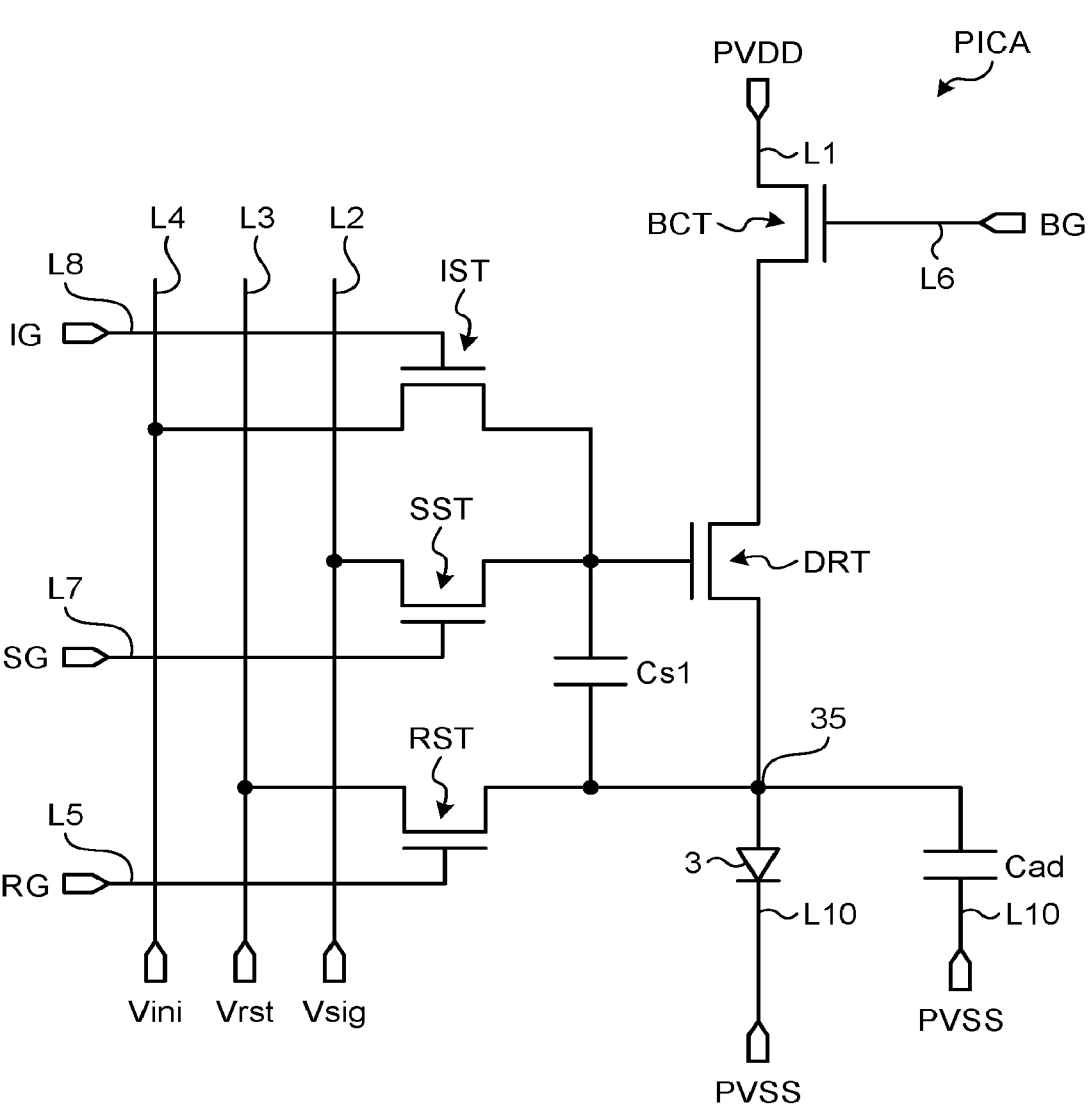
FIG. 3 is a circuit diagram of a pixel circuit.

FIG. 3 is a circuit diagram of a pixel circuit. FIG. 3 illustrates a pixel circuit PICA provided to one pixel 49, and a plurality of pixel circuits PICA are provided to the respective pixels 49. As illustrated in FIG. 3, the pixel circuit PICA includes the light-emitting element 3, five transistors, and two capacitances. Specifically, the pixel circuit PICA includes a drive transistor DRT, an output transistor BCT, an initialization transistor IST, a pixel selection transistor SST, and a reset transistor RST. The drive transistor DRT, the output transistor BCT, the initialization transistor IST, the pixel selection transistor SST, and the reset transistor RST are n-type thin-film transistors (TFTs). The pixel circuit PICA includes first capacitance Cs1 and second capacitance Cad.

The cathode (cathode terminal 32) of the light-emitting element 3 is coupled to a cathode power supply line L10. An anode (anode terminal 33) of the light-emitting element 3 is coupled to an anode power supply line L1 through the drive transistor DRT and the output transistor BCT. The anode power supply line L1 is supplied with an anode power supply potential PVDD. The cathode power supply line L10 is supplied with a cathode power supply potential PVSS via the cathode wiring 60 and the cathode electrode 34. The anode power supply potential PVDD is higher than the cathode power supply potential PVSS.

The anode power supply line L1 supplies the anode power supply potential PVDD serving as a drive potential to the pixel 49. Specifically, the light-emitting element 3 ideally emits light by being supplied with a forward current (drive current) due to the potential difference between the anode power supply potential PVDD and the cathode power supply potential PVSS (PVDD-PVSS). In other words, the anode power supply potential PVDD has a potential difference for causing the light-emitting element 3 to emit light with respect to the cathode power supply potential PVSS. The anode terminal 33 of the light-emitting element 3 is electrically coupled to an anode electrode 35. The second capacitance Cad serving as an equivalent circuit is coupled between the anode electrode 35 and the cathode power supply line L10 (cathode power supply potential PVSS).

The source electrode of the drive transistor DRT is coupled to the anode terminal 33 of the light-emitting element 3 through the anode electrode 35, and the drain electrode thereof is coupled to the source electrode of the output transistor BCT. The gate electrode of the drive transistor DRT is coupled to the first capacitance Cs1, the drain electrode of the pixel selection transistor SST, and the drain electrode of the initialization transistor IST.

The gate electrode of the output transistor BCT is coupled to the output control signal line L6. The output control signal line L6 is supplied with output control signals BG. The drain electrode of the output transistor BCT is coupled to the anode power supply line L1.

The source electrode of the initialization transistor IST is coupled to the initialization power supply line L4. The initialization power supply line L4 is supplied with an initialization potential Vini. The gate electrode of the initialization transistor IST is coupled to the initialization control signal line L8. The initialization control signal line L8 is supplied with initialization control signals IG. In other words, the gate electrode of the drive transistor DRT is coupled to the initialization power supply line L4 through the initialization transistor IST.

The source electrode of the pixel selection transistor SST is coupled to the video signal line L2. The video signal line L2 is supplied with video signals Vsig. The gate electrode of the pixel selection transistor SST is coupled to the pixel control signal line L7. The pixel control signal line L7 is supplied with pixel control signals SG.

The source electrode of the reset transistor RST is coupled to the reset power supply line L3. The reset power supply line L3 is supplied with a reset power supply potential Vrst.

The gate electrode of the reset transistor RST is coupled to the reset control signal line L5. The reset control signal line L5 is supplied with reset control signals RG. The drain electrode of the reset transistor RST is coupled to the anode electrode 35 (anode terminal 33 of the light-emitting element 3) and the source electrode of the drive transistor DRT. A reset operation performed by the reset transistor RST resets the voltage held in the first capacitance Cs1 and the second capacitance Cad.

The first capacitance Cs1 is provided as an equivalent circuit between the drain electrode of the reset transistor RST and the gate electrode of the drive transistor DRT. The pixel circuit PICA can suppress, by the first capacitance Cs1 and the second capacitance Cad, fluctuations in the gate voltage due to parasitic capacitance and current leakage in the drive transistor DRT.

In the following description, the anode power supply line L1 and the cathode power supply line L10 may be simply referred to as power supply lines. The video signal line L2, the reset power supply line L3, and the initialization power supply line L4 may be referred to as signal lines. The reset control signal line L5, the output control signal line L6, the pixel control signal line L7, and the initialization control signal line L8 may be referred to as gate lines.

The gate electrode of the drive transistor DRT is supplied with an electric potential corresponding to the video signal Vsig (or a gradation signal). More specifically, the drive transistor DRT supplies, to the light-emitting element 3, an electric current corresponding to a gate-source voltage Vgs set based on the video signal Vsig, the initialization potential Vini, and a threshold voltage Vth (DRT) of the drive transistor DRT. The gate-source voltage Vgs is expressed by the following Expression (1). In Expression (1), Cel is parasitic capacitance Cel of the light-emitting element 3.

$$Vgs=(Vsig-Vini)\times(Cel+Cad)/(Cs+Cel+Cad)+Vth \quad (DRT) \qquad (1)$$

Expression (1) indicates that increasing the second capacitance Cad can suppress fluctuations in the gate-source voltage Vgs due to the parasitic capacitance Cel. In other words, increasing the second capacitance Cad can suppress fluctuations in the electric current supplied to the light-emitting element 3. The second capacitance Cad is capacitance formed between a counter electrode 36 and the anode electrode 35 illustrated in FIG. 5, for example.

In the display device 1, the drive circuits 12 (illustrated in FIG. 1) select a plurality of pixel rows in order from the first row (e.g., the uppermost pixel row in the display region AA in FIG. 1). The drive IC 210 writes the video signals Vsig (video writing potential) to the pixels 49 of the selected pixel row, thereby causing the light-emitting elements 3 to emit light. The drive IC 210 supplies the video signals Vsig to the video signal line L2, supplies the reset power supply potential Vrst to the reset power supply line L3, and supplies the initialization potential Vini to the initialization power supply line L4 in each horizontal scanning period. The display device 1 repeats these operations for each image of one frame.

Figure 4:
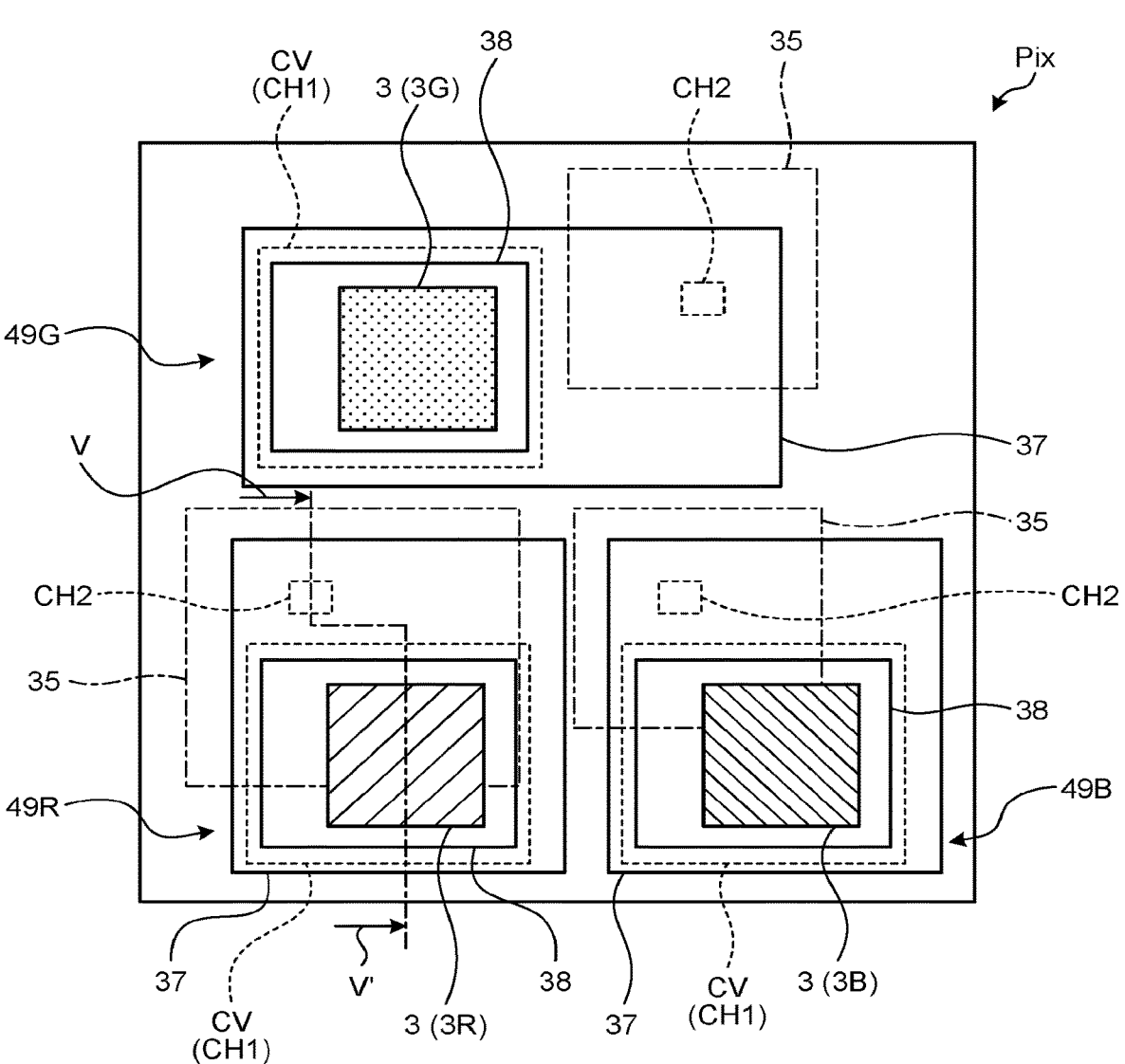
FIG. 4 is a plan view schematically illustrating the positional relation of a plurality of light-emitting elements, cavities, reflective layers, and anode electrodes.

The following describes the configuration of the display device 1 in greater detail. FIG. 4 is a plan view schematically illustrating the positional relation of a plurality of light-emitting elements, cavities, reflective layers, and anode electrodes. To simplify the explanation, FIG. 4 illustrates only a partial configuration of the array substrate 2. As illustrated in FIG. 4, the pixels 49R, 49G, and 49B include the light-emitting elements 3R, 3G, and 3B, respectively, and the anode electrodes 35, reflective layers 37, and joining members 38 electrically coupled to the light-emitting elements 3R, 3G, and 3B.

The light-emitting element 3 is disposed in a cavity CV formed in a first organic insulating film 24 (refer to FIG. 5) in planar view. The light-emitting element 3 is also disposed in a first contact hole CH1 formed in a second organic insulating film 26 (refer to FIG. 5) in planar view. The reflective layer 37 is provided covering the cavity CV and the first contact hole CH1 and has an area larger than that of the cavity CV and the first contact hole CH1. The light-emitting element 3 is electrically coupled to the reflective layer 37 through the joining member 38. The anode electrode 35 is provided with at least part thereof overlapping the reflective layer 37. The reflective layer 37 extends outside the cavity CV and is coupled to the anode electrode 35 through a second contact hole CH2 formed in the second organic insulating film 26 (refer to FIG. 5).

The cavity CV, the first contact hole CH1, the anode electrode 35, the reflective layer 37, and the joining member 38 of each light-emitting element 3 are isolated from those of another light-emitting element 3 (for each pixel 49). The shape and the positional relation of the anode electrode 35 and the reflective layer 37 in planar view can be appropriately changed depending on the configuration of each pixel 49. In the pixels 49R and 49B, for example, part of the anode electrode 35 is provided in a region overlapping the cavity CV and the light-emitting element 3. In the pixel 49G, the anode electrode 35 is provided in a region not overlapping the cavity CV or the light-emitting element 3.

Figure 5:
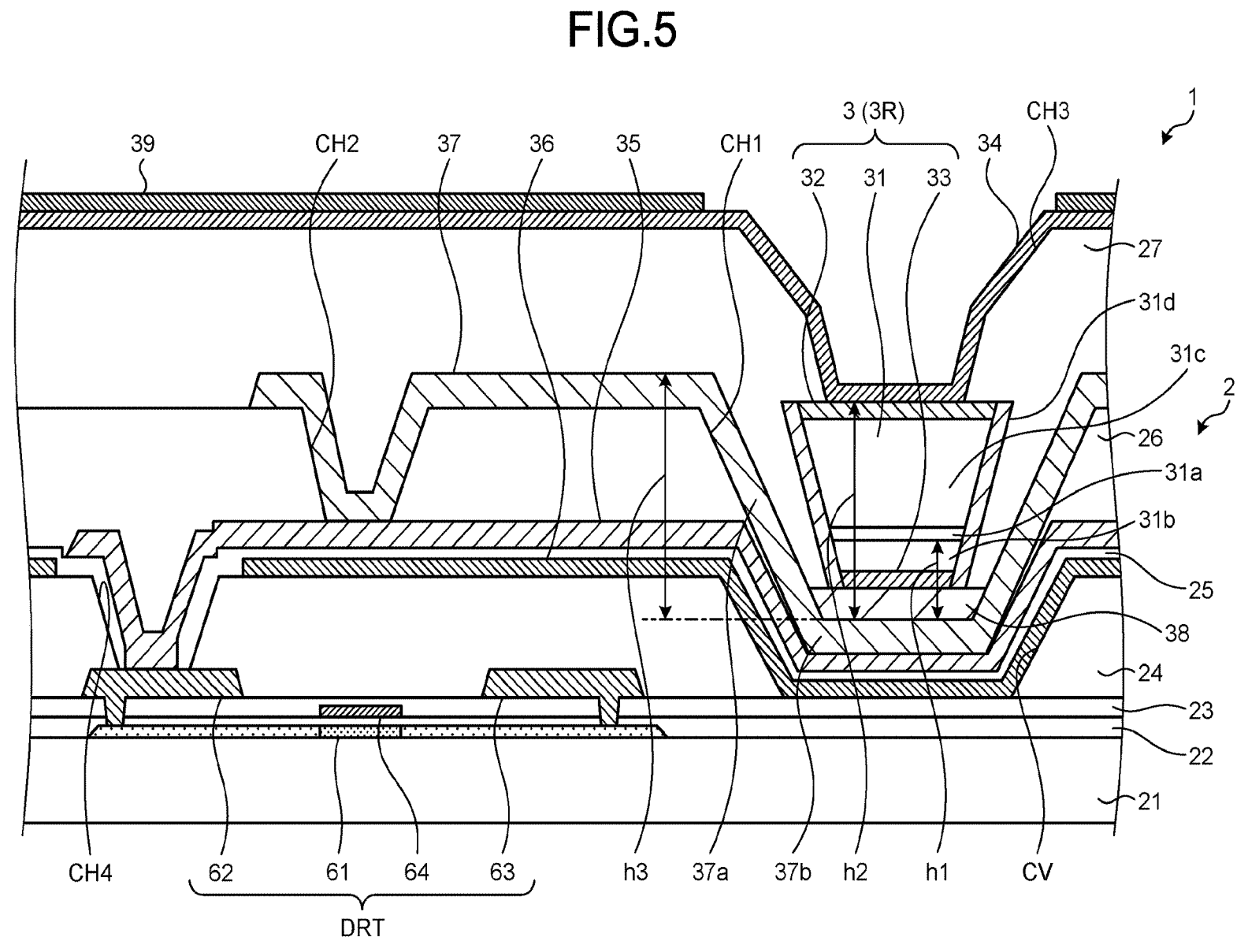

FIG. 5 is a sectional view along line V-V' of FIG. 4. As illustrated in FIG. 5, the light-emitting element 3 is provided on the array substrate 2. The array substrate 2 includes the substrate 21, various transistors, various kinds of wiring, and various insulating films. The substrate 21 is an insulating substrate and is a glass substrate, a resin substrate, or a resin film, for example.

In the present specification, a direction from the substrate 21 toward the light-emitting element 3 in a direction perpendicular to the surface of the substrate 21 is referred to as an "upper side" or simply as "top". A direction from the light-emitting element 3 toward the substrate 21 is referred to as a "lower side" or simply as "bottom".

The drive transistor DRT is provided on one surface of the substrate 21. While the drive transistor DRT is illustrated in FIG. 5, the output transistor BCT, the initialization transistor IST, the pixel selection transistor SST, and the reset transistor RST included in the pixel circuit PICA are also provided on the array substrate 2 (substrate 21).

A semiconductor layer 61 is provided on the substrate 21. An undercoat film may be provided between the semiconductor layer 61 and the substrate 21. An insulating film 22 is provided on the substrate 21 to cover the semiconductor layer 61. The insulating film 22 is a silicon oxide film, for example.

A gate electrode 64 is provided on the insulating film 22. In the example illustrated in FIG. 5, the drive transistor DRT has what is called a top-gate structure. The drive transistor DRT may have a bottom-gate structure in which the gate electrode is provided under the semiconductor layer or a dual-gate structure in which the gate electrodes are provided both on and under the semiconductor layer.

An insulating film 23 is provided on the insulating film 22 to cover the gate electrode 64. The insulating film 23 has a multilayered structure composed of a silicon nitride film and a silicon oxide film, for example. A source electrode 62 and a drain electrode 63 are provided on the insulating film 23.

The source electrode 62 is electrically coupled to the semiconductor layer 61 through a contact hole passing through the insulating films 22 and 23. The drain electrode 63 is electrically coupled to the semiconductor layer 61 through a contact hole formed in the insulating films 22 and 23.

A plurality of insulating films (the first organic insulating film 24, an inorganic insulating film 25, and the second organic insulating film 26) are provided covering the transistors. The first organic insulating film 24 and the second organic insulating film 26 are made of organic material, such as photosensitive acrylic. The organic material, such as photosensitive acrylic, is excellent in coverability for covering a difference in level of wiring and flatness on the surface compared with inorganic insulating material formed by chemical vapor deposition (CVD), for example. The inorganic insulating film 25 may be made of the same material as that of the insulating films 22 and 23 described above, such as a silicon nitride film.

Specifically, the first organic insulating film 24 is provided on the insulating film 23 to cover the source electrode 62 and the drain electrode 63. The first organic insulating film 24 is in direct contact with the source electrode 62 and the drain electrode 63. In the first organic insulating film 24, the cavity CV recessed toward the substrate 21 is formed in a region not overlapping the drive transistor DRT. In the example illustrated in FIG. 5, the cavity CV is formed passing through the first organic insulating film 24, and the insulating film 23 serves as the bottom of the cavity CV. The structure is not limited thereto, and the cavity CV may be formed without passing through the first organic insulating film 24.

The anode electrode 35 is provided on the first organic insulating film 24 and is electrically coupled to the light-emitting element 3. More specifically, the counter electrode 36, the inorganic insulating film 25, and the anode electrode 35 are stacked in order on the first organic insulating film 24. The counter electrode 36 is provided between the anode electrode 35 and the first organic insulating film 24 and faces the anode electrode 35 through the inorganic insulating film 25. The counter electrode 36 is made of translucent conductive material, such as indium tin oxide (ITO).

The inorganic insulating film 25 is provided to cover the counter electrode 36. The first organic insulating film 24 and the inorganic insulating film 25 have a fourth contact hole CH4 the bottom of which is formed by the source electrode 62. The counter electrode 36 has an opening in a region overlapping the fourth contact hole CH4, and the inorganic insulating film 25 covers the opening end of the counter electrode 36. The anode electrode 35 is electrically coupled to the source electrode 62 through the fourth contact hole CH4. As a result, the anode electrode 35 is electrically coupled to the drive transistor DRT.

The anode electrode 35 has a multilayered structure of titanium (Ti) and aluminum (Al), for example. The material of the anode electrode 35 is not limited thereto, and the anode electrode 35 may be made of material including at least one of metals of molybdenum (Mo) and Ti. Alternatively, the anode electrode 35 may be made of alloy including at least one of Mo and Ti or translucent conductive material. The anode electrode 35 does not necessarily have a multilayered structure of two or more layers and may have a multilayered structure of three layers of metals, such as Ti, Al, and Ti, or Mo, Al, and Mo. The second capacitance Cad is formed between the anode electrode 35 and the counter electrode 36 facing each other through the inorganic insulating film 25 as described above.

The anode electrode 35, the inorganic insulating film 25, and the counter electrode 36 are provided extending to a region overlapping the cavity CV to cover the sides and the bottom of the cavity CV. In the example illustrated in FIG. 5, the counter electrode 36 is provided in the same layer as that of the source electrode 62 and the drain electrode 63 on the insulating film 23 in a region overlapping the bottom of the cavity CV. The second capacitance Cad is also formed between the anode electrode 35 and the counter electrode 36 facing each other in the cavity CV. This configuration can make the facing area of the anode electrode 35 with the counter electrode 36 larger in at least a region overlapping the sides of the cavity CV than that in a configuration where the anode electrode 35, the inorganic insulating film 25, and the counter electrode 36 are provided on a flat first organic insulating film 24 in which no cavity CV is formed. As a result, the display device 1 can increase the second capacitance Cad.

The second organic insulating film 26 is provided on the inorganic insulating film 25 to cover the anode electrode 35. In other words, the first organic insulating film 24 is provided on the drive transistor DRT, and the second organic insulating film 26 is stacked on the first organic insulating film 24. In the second organic insulating film 26, the first contact hole CH1 is formed in a region overlapping the cavity CV. Also in the second organic insulating film 26, the second contact hole CH2 is formed in a region not overlapping the cavity CV and overlapping the anode electrode 35. The anode electrode 35 is provided at the bottoms of the first contact hole CH1 and the second contact hole CH2.

The reflective layer 37 is provided on the second organic insulating film 26 and is coupled to the anode electrode 35 at the bottom of the cavity CV through the first contact hole CH1 and to the anode electrode 35 through the second contact hole CH2. More specifically, the reflective layer 37 is provided covering the first contact hole CH1 formed in the second organic insulating film 26 and the cavity CV formed in the first organic insulating film 24. The reflective layer 37 has a side reflective layer 37a and a bottom reflective layer 37b in a region overlapping the cavity CV. The side reflective layer 37a is provided covering the sides of the first contact hole CH1 and the sides of the cavity CV. The bottom reflective layer 37b is provided covering the bottom of the first contact hole CH1 and the bottom of the cavity CV. The reflective layer 37 extends on the second organic insulating film 26 in a region outside the first contact hole CH1 and the cavity CV and is coupled to the anode electrode 35 through the second contact hole CH2.

The reflective layer 37 is made of metal material, such as aluminum, silver, aluminum alloy, and silver alloy. The reflective layer 37 is not necessarily made of metal material and can be any desired material that can reflect light output from the light-emitting element 3 to the display surface. In this case, the material of the reflective layer 37 may be acrylic resin mixed with alumina or titanium oxide particles, for example.

The light-emitting elements 3R, 3G, and 3B are mounted on the respective anode electrodes 35. More specifically, the light-emitting element 3 is disposed in the cavity CV and is coupled to the reflective layer 37 (bottom reflective layer 37b) through the joining member 38 at the bottom of the cavity CV. More specifically, the anode terminal 33 of the light-emitting element 3 is electrically coupled to the anode electrode 35 through the joining member 38 and the reflective layer 37 (bottom reflective layer 37b). The anode terminal 33 of the light-emitting element 3 is also electrically coupled to the anode electrode 35 through the reflective layer 37 provided on the second organic insulating film 26 and through the second contact hole CH2. With this configuration, the display device 1 can secure electrical coupling redundancy between the light-emitting element 3 and the anode electrode 35.

The joining member 38 between the anode terminal 33 of the light-emitting element 3 and the reflective layer 37 and anode electrode 35 may be made of any desired material as long as it can secure satisfactory continuity between them and does not damage the objects formed on the array substrate 2. The joining member 38 is made of solder or conductive paste, for example. Examples of the method for joining the anode terminal 33 to the reflective layer 37 and the anode electrode 35 include, but are not limited to, a method of reflowing using low-temperature melting soldering material, a method of placing the light-emitting element 3 on the array substrate 2 with conductive paste interposed therebetween and sintering them, etc.

The light-emitting element 3 is a face-up light-emitting element. The lower part of the light-emitting element 3 is electrically coupled to the anode electrode 35, and the upper part thereof is electrically coupled to the cathode electrode 34. The light-emitting element 3 includes a semiconductor layer 31, the cathode terminal 32, and the anode terminal 33. The semiconductor layer 31 may have a configuration including an active layer 31a, a p-type cladding layer 31b, and an n-type cladding layer 31c. The semiconductor layer 31 is stacked on the bottom of the cavity CV in the order of the p-type cladding layer 31b, the active layer 31a, and the n-type cladding layer 31c. The semiconductor layer 31 is made of a compound semiconductor, such as gallium nitride (GaN), aluminum indium phosphide (AlInP), and indium gallium nitride (InGaN). The semiconductor layer 31 may be made of different materials depending on the light-emitting elements 3R, 3G, and 3B. The active layer may have a multi-quantum well structure (MQW structure) in which well layers and barrier layers composed of several atomic layers are cyclically stacked for high efficiency.

With the configuration described above, the substrate 21, the insulating films 22 and 23, the counter electrode 36, the inorganic insulating film 25, the anode electrode 35, the reflective layer 37 (bottom reflective layer 37b), the joining member 38, and the light-emitting element 3 are stacked in order in the region overlapping the bottom of the cavity CV.

The reflective layer 37 (side reflective layer 37a) that covers the sides of the cavity CV and the sides of the first contact hole CH1 faces the side surfaces of the light-emitting element 3. A distance h1 between the bottom reflective layer 37b that covers the bottom of the cavity CV and the active layer 31a in the direction perpendicular to the substrate 21 is smaller than a distance h3 between the bottom reflective layer 37b and the upper end of the side reflective layer 37a that covers the sides of the cavity CV in the direction perpendicular to the substrate 21.

The distance h1 between the bottom reflective layer 37b that covers the bottom of the cavity CV and the active layer 31a in the direction perpendicular to the substrate 21 is equal to or smaller than one-half of a distance h2 between the bottom reflective layer 37b and the upper surface of the light-emitting element 3 (upper surface of the cathode terminal 32) in the direction perpendicular to the substrate 21.

The distance h3 between the bottom reflective layer 37b that covers the bottom of the cavity CV and the upper end of the side reflective layer 37a that covers the sides of the cavity CV in the direction perpendicular to the substrate 21 is larger than the distance h2 between the bottom reflective layer 37b and the upper surface of the light-emitting element 3 in the direction perpendicular to the substrate 21.

In the present embodiment, the cavity CV is formed in the first organic insulating film 24 that covers the drive transistor DRT. The reflective layer 37 is provided covering the sides of the cavity CV and the sides of the first contact hole CH1 in the second organic insulating film 26. This configuration can make the distance h3 larger than that in a configuration forming no cavity CV in the first organic insulating film 24. In other words, this configuration can increase the area of the reflective layer (side reflective layer 37a) facing the side surfaces of the light-emitting element 3.

With this configuration, the reflective layer 37 (side reflective layer 37a) facing the side surfaces of the light-emitting element 3 reflects light output from the side surfaces of the light-emitting element 3 upward (toward the display surface). Consequently, the display device 1 can improve the light extraction efficiency.

The light-emitting element 3 further includes a protective film 31d that covers its side surfaces. The protective film 31d is provided covering the side surfaces of the cathode terminal 32, the semiconductor layer 31, and the anode terminal 33 of the light-emitting element 3. As a result, the reflective layer 37 (side reflective layer 37a) that covers the sides of the cavity CV is provided facing the protective film 31d of the light-emitting element 3. The protective film 31d is made of insulating material and is disposed between at least the side surfaces of the cathode terminal 32 and the semiconductor layer 31 of the light-emitting element 3 and the reflective layer 37 (side reflective layer 37a). This configuration can prevent a short-circuit between the reflective layer 37 and the active layer 31a and the n-type cladding layer 31c of the light-emitting element 3 if the light-emitting element 3 is disposed in the cavity CV. The protective film 31d may be provided covering the side surfaces of the semiconductor layer 31 stacked on a sapphire substrate, for example.

An element insulating film 27 is provided between the light-emitting elements 3. The element insulating film 27 is made of resin material. The element insulating film 27 covers at least the side surfaces of the light-emitting element 3 and has a third contact hole CH3 in a region overlapping the light-emitting element 3. The cathode terminal 32 of the light-emitting element 3 is exposed from the element insulating film 27 at the bottom of the third contact hole CH3.

The cathode electrode 34 is provided on the element insulating film 27 and is electrically coupled to the light-emitting elements 3 through the third contact holes CH3. The cathode electrode 34 is made of translucent conductive material, such as ITO. This configuration can efficiently extract light output from the light-emitting elements 3 to the outside. The cathode electrode 34 is electrically coupled to the cathode terminals 32 of the light-emitting elements 3 mounted on the display region AA. The cathode electrode 34 is also coupled to the cathode wiring 60 (refer to FIG. 1) provided on the array substrate 2 at a contact part (not illustrated) provided outside the display region AA.

A light-blocking film 39 is provided covering the cathode electrode 34 and has an opening formed in a region overlapping the light-emitting element 3. Light output from the upper surface of the light-emitting element 3 and light output from the side surfaces of the light-emitting element 3 and reflected by the reflective layer 37 are output to the display surface through the opening in the light-blocking film 39.

The light-blocking film 39 is a low-reflective film made of material having higher light absorbance than the cathode electrode 34, for example. The light-blocking film 39 is made of black-colored resin material, carbon, or metal oxide, carbide, or metal carbide that shows black due to thin-film interference. Providing the light-blocking film 39 can prevent light incident from the outside from being reflected by the reflective layer 37 and various kinds of wiring on the array substrate 2.

As described above, the display device 1 provided with the light-emitting elements 3 as the display elements is configured. The display device 1 may include an overcoat layer or a cover substrate on the cathode electrode 34 (and the light-blocking film 39) as necessary. The display device 1 may further include a circularly polarizing plate, a touch panel, and other components on the cathode electrode 34.

In the display device 1, the light-emitting element 3 does not necessarily have the face-up structure in which the lower part of the light-emitting element 3 is coupled to the anode electrode 35, and the upper part thereof is coupled to the cathode electrode 34. The light-emitting element 3 may be what is called a flip-chip light-emitting element in which the lower part of the light-emitting element 3 is coupled to the anode electrode 35 and the cathode electrode 34. In this case, the cathode electrode 34 illustrated in FIG. 5 is not provided on the element insulating film 27 and is provided in the same layer as that of the anode electrode 35.

As described above, the display device 1 according to the present embodiment includes the substrate 21 (array substrate 2), the light-emitting elements 3 and the transistors (e.g., the drive transistor DRT), the first organic insulating film 24, the anode electrode 35, the cavity CV, and the reflective layer 37. The light-emitting elements 3 and the transistors are provided to the substrate 21. The first organic insulating film 24 is provided covering the transistors and is in direct contact with at least one of the source electrode 62 and the drain electrode 63 of the transistors. The anode electrode 35 is provided on the first organic insulating film 24 and is electrically coupled to each of the light-emitting elements 3. The cavity CV is formed in the first organic insulating film 24 and is recessed toward the substrate 21. The reflective layer 37 is provided covering the sides and the bottom of the cavity CV formed in the first organic insulating film 24. The light-emitting element 3 is disposed in the cavity CV and is electrically coupled to the reflective layer 37 at the bottom of the cavity CV. The side reflective layer 37*a* of the reflective layer 37 that covers the sides of the cavity CV faces the side surfaces of the light-emitting element 3.

With this configuration, the display device 1 according to the present embodiment can make the area of the reflective layer 37 (side reflective layer 37*a*) facing the side surfaces of the light-emitting element 3 larger than that in a configuration forming no cavity CV in the first organic insulating film 24. The reflective layer 37 (side reflective layer 37*a*) facing the side surfaces of the light-emitting element 3 reflects light output from the side surfaces of the light-emitting element 3 upward (toward the display surface). Consequently, the display device 1 can improve the light extraction efficiency.

While exemplary embodiments according to the present invention have been described, the embodiments are not intended to limit the invention. The contents disclosed in the embodiments are given by way of example only, and various modifications may be made without departing from the spirit of the present invention. Appropriate modifications made without departing from the spirit of the present invention naturally fall within the technical scope of the invention. At least one of various omissions, substitutions, and modifications of the components may be made without departing from the gist of the embodiments above and the modification thereof.

What is claimed is:

1. A display device comprising:
   a substrate;
   a plurality of light-emitting elements and a plurality of transistors provided to the substrate;
   a first organic insulating film that is provided covering the transistors and is in direct contact with at least one of a source electrode and a drain electrode of the transistors;
   an anode electrode provided on the first organic insulating film and electrically coupled to each of the light-emitting elements;
   a cavity formed in the first organic insulating film and recessed toward the substrate;
   a reflective layer provided covering a side and a bottom of the cavity formed in the first organic insulating film; and
   a counter electrode provided between the anode electrode and the first organic insulating film and facing the anode electrode through an inorganic insulating film,
   wherein
   the light-emitting element is disposed in the cavity and is electrically coupled to the reflective layer at the bottom of the cavity,
   a side reflective layer of the reflective layer that covers the side of the cavity faces a side surface of the light-emitting element,
   the anode electrode, the inorganic insulating film, and the counter electrode are provided covering the side and the bottom of the cavity, and
   the reflective layer is coupled to the anode electrode at the bottom of the cavity.

2. The display device according to claim 1, further comprising:
   a second organic insulating film provided covering the anode electrode, wherein
   the second organic insulating film has a first contact hole formed in a region overlapping the cavity and a second contact hole formed in a region not overlapping the cavity and overlapping the anode electrode, and
   the reflective layer is provided on the second organic insulating film and is coupled to the anode electrode at the bottom of the cavity through the first contact hole and to the anode electrode through the second contact hole.

3. The display device according to claim 1, further comprising:
   a protective film that covers the side surface of the light-emitting element, wherein
   the side reflective layer faces the protective film of the light-emitting element.

4. The display device according to claim 1, wherein
   the light-emitting element comprises a p-type cladding layer, an active layer, and an n-type cladding layer, and
   a distance between a bottom reflective layer of the reflective layer that covers the bottom of the cavity and the active layer in a direction perpendicular to the substrate is smaller than a distance between the bottom reflective layer and an upper end of the side reflective layer in the direction perpendicular to the substrate.

5. The display device according to claim 1, wherein
   the light-emitting element comprises a p-type cladding layer, an active layer, and an n-type cladding layer, and a distance between a bottom reflective layer of the reflective layer that covers the bottom of the cavity and the active layer in a direction perpendicular to the substrate is equal to or smaller than one-half of a distance between the bottom reflective layer and an upper surface of the light-emitting element in the direction perpendicular to the substrate.

6. The display device according to claim 1, wherein the light-emitting element comprises a p-type cladding layer, an active layer, and an n-type cladding layer, and a distance between a bottom reflective layer of the reflective layer that covers the bottom of the cavity and an upper end of the side reflective layer in a direction perpendicular to the substrate is larger than a distance between the bottom reflective layer and an upper surface of the light-emitting element in the direction perpendicular to the substrate.

7. The display device according to claim 1, further comprising:
an element insulating film provided covering at least the side surface of the light-emitting element;
a cathode electrode provided on the element insulating film and electrically coupled to the light-emitting elements; and
a light-blocking film provided covering the cathode electrode and having an opening formed in a region overlapping the light-emitting element.

* * * * *